United States Patent
Ha et al.

(10) Patent No.: US 11,538,994 B2
(45) Date of Patent: Dec. 27, 2022

(54) MASK ASSEMBLY AND METHOD FOR MANUFACTURING THE SAME

(71) Applicant: Samsung Display Co., Ltd., Yongin-Si (KR)

(72) Inventors: Jaesoo Ha, Asan-si (KR); Suhwan Lee, Asan-si (KR); Kwangtae Yu, Seoul (KR); Seungwook Chang, Suwon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/598,910

(22) Filed: Oct. 10, 2019

(65) Prior Publication Data

US 2020/0176681 A1   Jun. 4, 2020

(30) Foreign Application Priority Data

Nov. 29, 2018  (KR) .................. 10-2018-0150724

(51) Int. Cl.
| | | |
|---|---|---|
| *C23C 14/04* | (2006.01) | |
| *H01L 51/00* | (2006.01) | |
| *H01L 51/56* | (2006.01) | |
| *C23C 16/04* | (2006.01) | |

(52) U.S. Cl.
CPC ........ *H01L 51/0011* (2013.01); *C23C 14/042* (2013.01); *C23C 16/042* (2013.01); *H01L 51/001* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 9,284,638 B2 | 3/2016 | Ko et al. | |
| 9,748,485 B2 | 8/2017 | Lee | |
| 9,806,257 B2 | 10/2017 | Takeda et al. | |
| 10,053,767 B2 | 8/2018 | Mizumura | |
| 2008/0118743 A1* | 5/2008 | Lee | C23C 14/042 428/332 |
| 2014/0251210 A1* | 9/2014 | Jung | C23C 14/042 118/504 |
| 2017/0110661 A1* | 4/2017 | Lee | C23C 14/042 |
| 2017/0117475 A1 | 4/2017 | Kim et al. | |
| 2019/0352764 A1* | 11/2019 | Nakajima | C23C 14/042 |

FOREIGN PATENT DOCUMENTS

| | | |
|---|---|---|
| KR | 10-2011-0032284 A | 3/2011 |
| KR | 10-2014-0087823 A | 7/2014 |
| KR | 10-2016-0029032 A | 3/2016 |
| KR | 10-1659948 B1 | 10/2016 |
| KR | 10-2017-0045427 A | 4/2017 |
| KR | 10-1910912 B1 | 10/2018 |
| KR | 10-1913363 B1 | 10/2018 |

* cited by examiner

*Primary Examiner* — Binu Thomas
(74) *Attorney, Agent, or Firm* — Innovation Counsel LLP

(57) ABSTRACT

Provided is a mask assembly. The mask assembly includes a mask frame and a mask. The mask is coupled to the mask frame to distinguish first to third deposition areas from each other. Each of the first and third deposition areas has a first width greater than a reference width in a first direction and a second width less than the first width in a second direction. The second deposition area has a third width less than the first width in the first direction and a fourth width less than the reference width in the second direction.

3 Claims, 14 Drawing Sheets

MASK ASSEMBLY AND METHOD FOR MANUFACTURING THE SAME

CROSS-REFERENCE TO RELATED APPLICATIONS

This U.S. non-provisional patent application claims priority under 35 U.S.C. § 119 of Korean Patent Application No. 10-2018-0150724, filed on Nov. 29, 2018, the entire contents of which are hereby incorporated by reference.

BACKGROUND

The present disclosure herein relates to a mask assembly and a method for manufacturing the same, and more particularly, to a mask assembly that is capable of being applied to a deposition process of a display device and a method for manufacturing the same.

Display devices output an image through a display area to provide various visual information to a user. An organic light emitting display device of the display devices has advantages that a viewing angle is wide, contrast is excellent, and a response speed is high. The display area of the organic light emitting display device is constituted by a plurality of pixels. The plurality of pixels may form the display area through a process of depositing a deposition material.

The deposition process of the organic light emitting display device may be performed through a deposition area defined by a mask. Firm fixation of the mask and positioning accuracy of the deposition area are important factors in terms of yield and reliability of the organic light emitting display device.

Display devices such as televisions have become large-sized. Thus, the mask required for the deposition process is also increasing in size. As the size of the mask increases, manufacturing and processing of constituents provided in the mask may be restricted.

SUMMARY

The present disclosure provides a mask assembly, which has improved cutting efficiency and is capable of manufacturing a display panel having various areas, and a method for manufacturing the same.

The present disclosure also provides a mask assembly, in which positioning accuracy of a mask is improved, and deformation and a stepped portion of the mask are reduced, and a method for manufacturing the same.

An embodiment of the inventive concept provides a mask assembly including a mask frame and a mask. The mask frame includes a first support part extending in a first direction, a second support part spaced apart from the first support part and extending in the first direction, a third support part extending in a second direction and disposed between one end of the first support part and one end of the second support part, and a fourth support part spaced apart from the third support part, extending in the second direction, and disposed between the other end of the first support part and the other end of the second support part. The mask is coupled to the mask frame and including a first deposition area, a second deposition area adjacent to the first deposition area in the first direction and a third deposition area adjacent to the first deposition area in the second direction.

Each of the first deposition area and the third deposition area has a first width greater than a reference width in the first direction and a second width less than the first width in the second direction. The second deposition area has a third width less than the first width in the first direction and a fourth width greater than the reference width in the second direction.

In an embodiment, the mask may further include a fourth deposition area adjacent to the second deposition area in the second direction and a fifth deposition area adjacent to the third deposition area in the second direction and adjacent to the fourth deposition area in the first direction. In an embodiment, the fourth deposition area may have the third width in the first direction and the fourth width in the second direction. In an embodiment, the fifth deposition area may have the first width in the first direction and the second width in the second direction.

In an embodiment, the mask may include: a first extension part extending in the second direction and coupled between the first support part and the second support part, the first extension part being spaced the first width apart from the third support part; and a second extension part extending in the first direction and coupled between the third support part and the first extension part, the second extension part being spaced the second width apart from the first support part.

In an embodiment, the first extension part may have a first thickness, and the second extension part may have a second thickness, wherein the first thickness may be greater than the second thickness.

In an embodiment, the first extension part may have a triangular shape or trapezoidal shape in a cross-sectional view. In an embodiment, the first extension part may include a recess part coupled to the second extension part.

In an embodiment, the mask may include: a first masking part coupled to the first support part and the third support part, and disposed corresponding to the first deposition area; a second masking part coupled to the first support part, the fourth support part and the first masking part, and disposed corresponding to the second deposition area; and a third masking part coupled to the third support part, the first masking part and the second masking part, and disposed corresponding to the third deposition area.

In an embodiment, thicknesses of the first to third masking parts may be the same.

In an embodiment, the mask may include a first masking part coupled to the first support part and the third support part, and disposed corresponding to the first deposition area, a second masking part coupled to the first support part and the fourth support part, contacting the first masking part, and disposed corresponding to the second deposition area, a third masking part coupled to the third support part, contacting the first masking part and the second masking part, and disposed corresponding to the third deposition area, and a backing part. In an embodiment, the backing part may be disposed on an area, on which the first masking part and the second masking part contact each other, an area, on which the first masking part and the third masking part contact each other, and an area, on which the second masking part and the third masking part contact each other. In an embodiment, the backing part may be coupled in a third direction crossing the first and second directions from the first to third masking parts.

In an embodiment of the inventive concept, a method for manufacturing a mask assembly includes: preparing a mask frame including a first support part extending in a first direction, a second support part spaced apart from the first support part and extending in the first direction, a third support part extending in a second direction and disposed between one end of the first support part and one end of the second support part, and a fourth support part spaced apart from the third support part, extending in the second direction, and disposed between the other end of the first support part and the other end of the second support part; coupling a first extension part having a first thickness between a first support part and a second support part; and coupling a second extension part having a second thickness less than the first thickness between a third support part and the first extension part. In an embodiment, the first extension part may be spaced apart from the third support part by a first width greater than a reference width, and the second extension part may be spaced apart from the first support part by a second width less than the first width.

In an embodiment, the method may further include: coupling a third extension part having the second thickness between a fourth support part and the first extension part; and coupling a fourth extension part having the second thickness between the third support part and the first extension part. In an embodiment, the third extension part may be spaced apart from the first support part by a third width greater than the reference width and less than the first width, and the fourth extension part may be spaced the second width apart from the second extension part.

In an embodiment, the coupling of the first extension part may include: coupling a nut in the first support part and one end of the first extension part using a bolt; and coupling a nut in the second support part and the other end of the first extension part using a bolt.

In an embodiment, the coupling of the second extension part may include: welding one end of the second extension part to a coupling area of the first extension part; and welding the other end of the second extension part to a coupling area of the third support part.

In an embodiment, the method may further include comprising removing a portion of the coupling area of the first extension part before the coupling of the second extension part. In an embodiment, the method may further include removing a portion of the end of the second extension part before the coupling of the second extension part.

In an embodiment of the inventive concept, a method for manufacturing a mask assembly includes: providing a first masking part having a first width greater than a reference width in a first direction and a second width less than the reference width in a second direction crossing the first direction; coupling a second masking part having the first width in the first direction and the second width in the second direction to the first masking part so as to be adjacent in the second direction; and coupling a third masking part having a third width less than the reference width in the first direction and a fourth width greater than the reference width in the second direction to the first and second masking parts so as to be adjacent in the first direction.

In an embodiment, the coupling of the second masking part may include: contacting the first masking part and the second masking part with each other; disposing a backing part on an area on which the first and second masking parts contact each other; and welding the first and second masking parts to the backing part.

In an embodiment, the method may further include coupling the first to third masking parts to a mask frame. In an embodiment, the method may further include cutting a sheet having the reference width to form the first to third masking parts.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
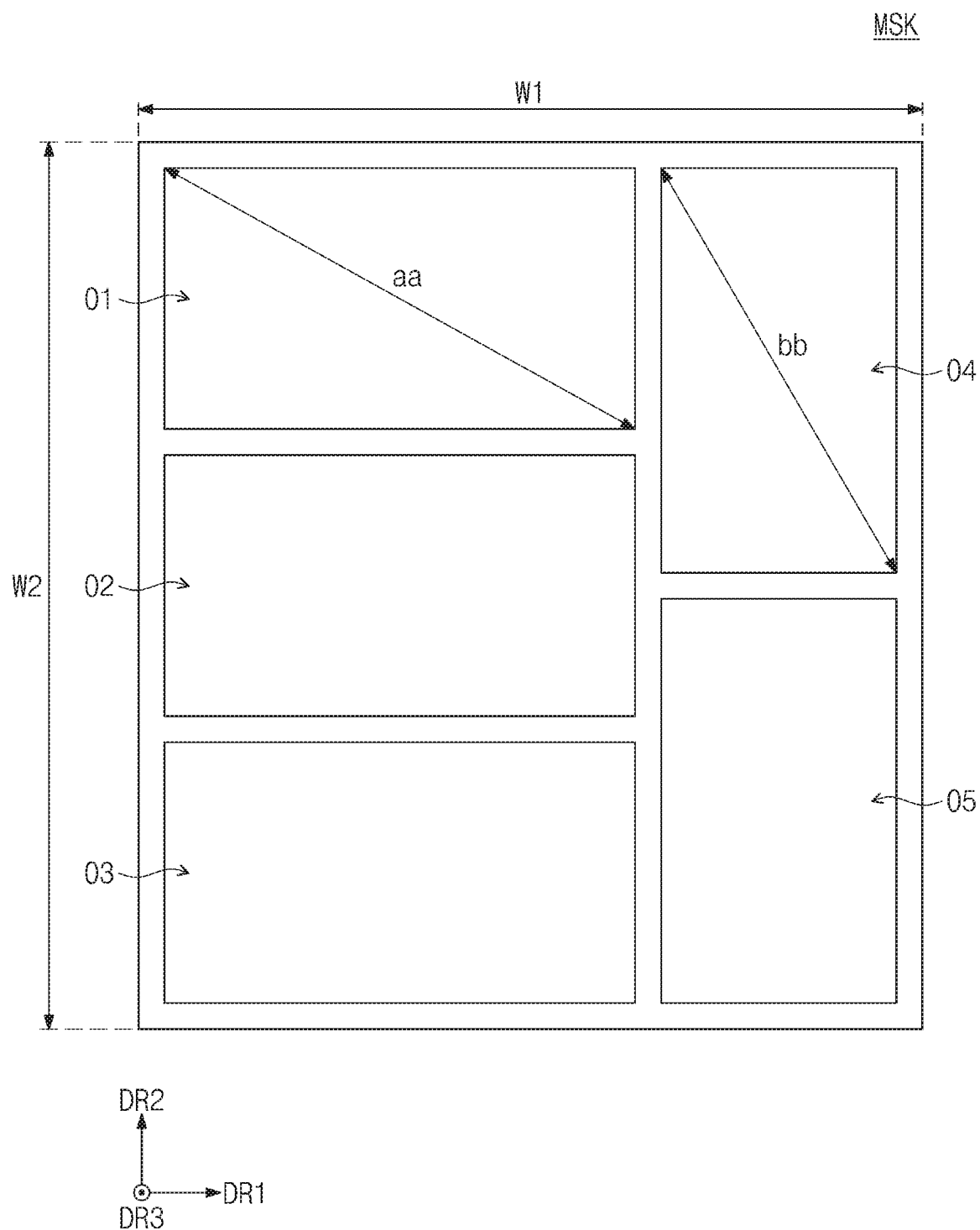
FIG. 1 is a view illustrating an example of a mask according to an embodiment of the inventive concept.

Because the present disclosure may have diverse modified embodiments, specific embodiments are illustrated in the drawings and are described in the detailed description of the inventive concept. However, this does not limit the present disclosure within specific embodiments and it should be understood that the present disclosure covers all the modifications, equivalents, and replacements within the idea and technical scope of the present disclosure.

Like reference numerals refer to like elements throughout. It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

The meaning of 'include' or 'comprise' specifies a property, a region, a fixed number, a step, a process, an element and/or a component but does not exclude other properties, regions, fixed numbers, steps, processes, elements and/or components.

FIG. 1 is a view illustrating an example of a mask according to an embodiment of the inventive concept. Referring to FIG. 1, a mask MSK may include first to fifth deposition areas O1 to O5. The first to fifth deposition areas O1 to O5 may be openings. The mask MSK may be an open mask. Each of the first to fifth deposition areas O1 to O5 may have an area corresponding to that of a display panel.

In FIG. 1, for convenience of description, first to third directions DR1 to DR3 are defined. The first to third directions DR1 to DR3 may be perpendicular to each other. A surface defined by the first direction DR1 and the second direction DR2 may be parallel to a deposition surface defined by the mask MSK. The third direction DR3 may be perpendicular to a plane formed by the first direction and the second direction and be a deposition direction.

The mask MSK may have a first width W1 in the first direction DR1 and a second width W2 in the second direction DR2. The first width W1 and the second width W2 may correspond to an area of a substrate disposed on the mask MSK on which a film is deposited. The substrate may have an area greater than that of each of the plurality of display panels generated by the deposition process. For example, the first width W1 may be about 2,200 mm, and the second width W2 may be about 2,500 mm. If it is assumed that an aspect ratio of the display panel is about 16:9, cutting efficiency and the number of acquired display panels may be calculated as shown in Table 1 under the above-described conditions of the first and second widths W1 and W2.

TABLE 1

| Inch (16:9) | Acquisition Number | Cutting Efficiency |
| --- | --- | --- |
| 27 | 24 | 94% |
| 30 | 18 | 86% |
| 43 | 8 | 76% |
| 55 | 6 | 94% |
| 60 | 3 | 56% |
| 65 | 3 | 65% |
| 75 | 2 | 58% |
| 85 | 2 | 74% |
| 95 | 2 | 93% |
| 130 | 0 | 0 |

Referring to Table 1, the cutting efficiency between about 60 inches and about 85 inches is lower than that of the other size of the panels. For example, only three sheets of 65-inch display panels may be acquired using the substrate having about 2,200 mm of the first width and about 2,500 mm of the second width, and the cutting efficiency is only about 65%. The mask MSK of FIG. 1 may be used to manufacture display panels having different sizes, for example, three 65-inch display panel and two 55-inch display panel on the same substrate to improve the cutting efficiency. By forming the two 55-inch display panel on a substrate which may be discarded, for example, the remaining 35% of the substrate, the cutting efficiency of the substrate increases.

The mask MSK may include the deposition areas having at least two different sizes. For example, diagonal lengths of the first to third deposition areas O1 to O3 may be the same, and each of the diagonal lengths may be defined as a first length aa. For example, the first length aa may be about 65 inches. For example, diagonal lengths of the fourth and fifth deposition areas O4 and O5 may be the same, and each of the diagonal lengths may be defined as a second length bb. For example, the second length bb may be about 55 inches. That is, more display panels may be further acquired by using the area corresponding to about 35% remaining portion of the substrate. Thus, the cutting efficiency may be improved, and the number of display panels to be acquired may increase.

The mask assembly that will be described below may include the first to fifth deposition areas O1 to O5. However, the embodiment of the inventive concept is not limited thereto. For example, the different number of deposition areas may be provided. For example, the mask MSK may include six deposition areas, each of which has the second length bb that corresponds to 32 inches, instead of the fourth and fifth deposition areas O4 and O5, each of which has the second length bb that corresponds to 55 inches.

Figure 2:
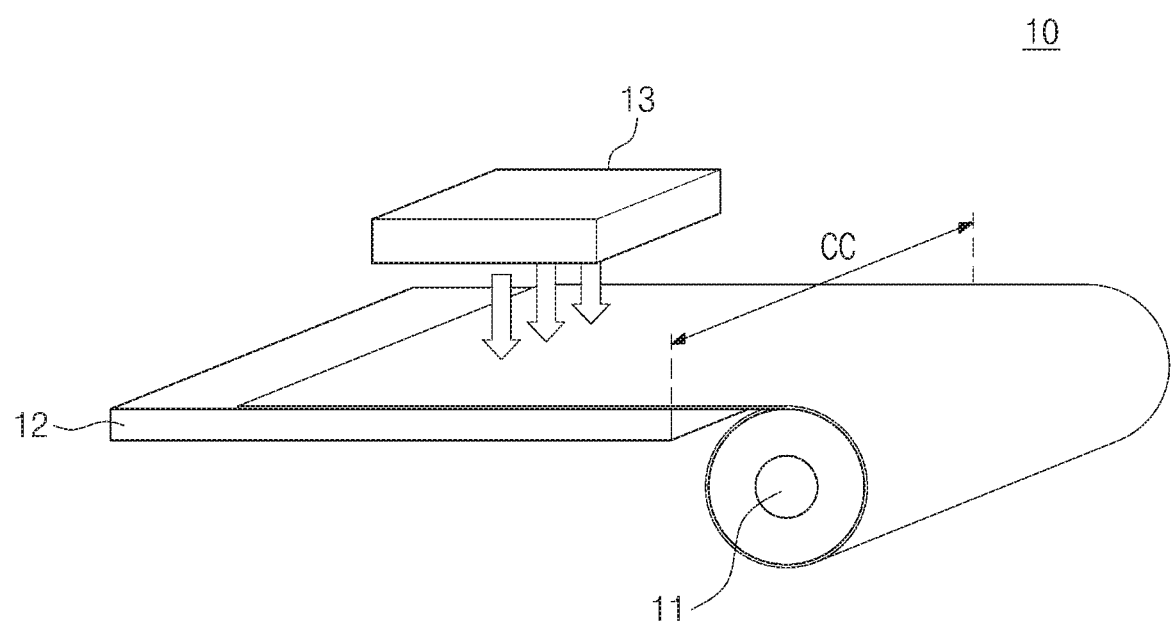
FIG. 2 is a view illustrating an example of an apparatus for manufacturing a material contained in the mask of FIG. 1.

FIG. 2 is a view illustrating an example of an apparatus for manufacturing a material contained in the mask of FIG. 1. Referring to FIG. 2, a manufacturing apparatus 10 may include a roller 11, a conveyor 12, and a processing device 13. The manufacturing apparatus 10 of FIG. 2 may be understood as an exemplary structure, and thus, the manufacturing apparatus 10 is not limited to the structure of FIG. 2.

The roller 11 provides a metal sheet that is a raw material for the mask MSK to the conveyor 12. The metal sheet is wound around the roller 11. Thus, when the roller 11 rotates, the metal sheet may be provided to the conveyor 12. The metal sheet is included in the mask MSK of FIG. 1. A portion of the metal sheet may be etched or cut by the processing device 13. For example, the metal sheet may be an invar sheet.

The metal sheet or the conveyor may have a reference width CC which is a width measured parallel to an extending direction of a rotation axis of the roller 11. As the display panel increases in size and the plurality of display panels are manufactured by using one mask, the mask MSK may increase in size too. In this case, each of the first and second widths W1 and W2 of FIG. 1 may be greater than the reference width CC. Furthermore, a long side of each of the first to fifth deposition areas O1 to O5 may have a length greater than the reference width CC. For example, when the reference width CC is about 1000 mm, the reference width CC may be less than each of the first width W1 which is 2200 mm and the second widths W2 which is 2500 mm of the mask MSK of FIG. 1. Also, the reference width CC is less than the length of each of the long sides of the 65-inch display panel and the 55-inch display panel. Thus, the manufacturing apparatus 10 may not manufacture a complete mask MSK directly by using the metal sheet having a reference width CC of 1000 mm which is narrower than the length of each of the long sides of the 65-inch display panel and the 55-inch display panel.

Figure 3:
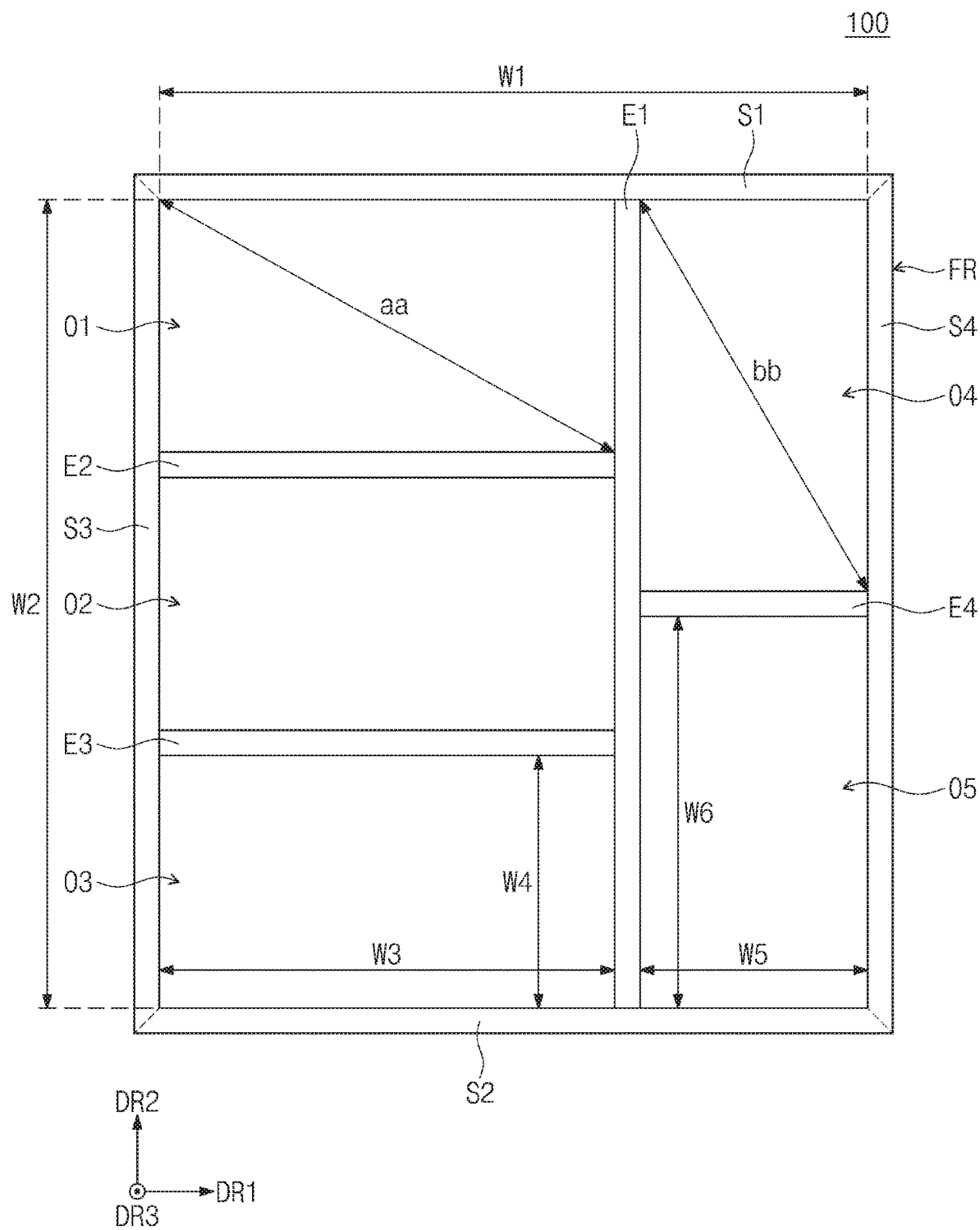
FIG. 3 is a view illustrating an example of a mask assembly according to an embodiment of the inventive concept.

FIG. 3 is a view illustrating an example of a mask assembly according to an embodiment of the inventive concept. The mask assembly 100 of FIG. 3 may be manufactured in the same shape as that of FIG. 1 under the conditions described with reference to FIG. 2. Referring to FIG. 3, the mask assembly 100 includes a mask frame FR and first to fourth extension parts E1 to E4. Each of the mask frame FR and the first to fourth extension parts E1 to E4 may include a material such as invar, but the material is not limited thereto. Like the mask MSK of FIG. 1, the mask assembly 100 may include the first to fifth deposition areas O1 to O5.

The mask frame FR may have a rectangular shape in a plan view. The mask frame FR includes first to fourth support parts S1 to S4. The first support part S1 and the second support part S2 may extend in the first direction DR1 and be spaced apart from each other. The third support part S3 and the fourth support part S4 may extend in the second direction DR2 and be spaced apart from each other with the first and second support parts S1 and S2 disposed therebetween. An opening having the first width W1 in the first direction DR1 and the second width W2 in the second direction DR2 may be defined by the first to fourth support parts S1 to S4.

When the deposition process is performed, the substrate may be disposed on the mask frame FR. To firmly support the substrate, a thickness of the mask frame FR in the third direction may be greater than that of the metal sheet of FIG. 2. For example, a groove may be provided in the mask frame FR to correspond to the area of the substrate so as to prevent the substrate from moving when the deposition process is performed.

The first extension part E1 extends in the second direction DR2 and is connected between the first support part S1 and the second support part S2. The first extension part E1 has one end coupled to the first support part S1 and the other end coupled to the second support part S2. The first extension part E1 may be spaced a third width W3 apart from the third support part S3 in the first direction DR1 and be spaced a fifth width W5 apart from the fourth support part S4 in the first direction DR1. The third width W3 may correspond to a width of each of the first to third deposition areas O1 to O3 in the first direction DR1 and the fifth width W5 may correspond to a width of each of the fourth and fifth deposition areas O4 and O5 in the first direction DR1. Here, the third width W3 may be greater than the reference width CC of FIG. 2.

The second extension part E2 and the third extension part E3 extend in the first direction DR1 and is connected between the third support part S3 and the first extension part E1. Each of the second and third extension parts E2 and E3 may have one end coupled to the first extension part E1 and the other end coupled to the third support part S3. The second extension part E2 and the third extension part E3 may be spaced apart from each other in the second direction. The second extension part E2 may be spaced a fourth width W4 apart from the first support part S1 in the second direction DR2. The third extension part E3 may be spaced the fourth width W4 apart from the second extension part E2 in the second direction DR2 and be spaced the fourth width W4 apart from the second support part S2 in the second direction DR2. The fourth width W4 may correspond to the width of each of the first to third deposition areas O1 to O3 in the second direction DR2.

The fourth extension part E4 extends in the first direction DR1 and is connected between the fourth support part S4 and the first extension part E1. The fourth extension part E4 has one end coupled to the first extension part E1 and the other end coupled to the fourth support part S4. The fourth extension part E4 may be spaced a sixth width W6 apart from the first support part S1 in the second direction DR2 and be spaced the sixth width W6 apart from the second support part S2 in the second direction DR2. The sixth width W6 may correspond to the width of each of the fourth and fifth deposition areas O4 and O5 in the second direction DR2. Here, the sixth width W6 may be greater than the reference width CC of FIG. 2.

A width perpendicular to the extension direction of each of the first to fourth extension parts E1 to E4 may be less than the reference width CC. Thus, the first to fourth extension parts E1 to E4 may be manufactured through the manufacturing apparatus 10 of FIG. 2. As the first to fourth extension parts E1 to E4 are coupled to the mask frame FR, the mask assembly 100 for manufacturing the large-area display panel may be prepared. When the first to fourth extension parts E1 to E4 are manufactured by using the metal sheet, each of the first to fourth extension parts E1 to E4 is extended in a direction (extension direction) in contact with the mask frame FR and then be coupled (e.g., welded) to the mask frame FR while maintain the tension.

However, when the second to fourth extension parts E2 to E4 are extended, the first extension part E1 may be deformed. When the first extension part E1 is manufactured as the metal sheet using the manufacturing apparatus 10, it is difficult to secure rigidity of the first extension part E1. Thus, when the second extension part E2 maintains the tension toward the third support part S3, the first extension part E1 may be bent toward the third support part S3. If tensile force in the second extension part E2 is reduced to prevent the first extension part E1 from being bent, the second extension part E2 may droop in the third direction DR3. Hereinafter, a method for manufacturing the mask assembly 100 so as to solve the above limitation will be described.

Figure 4A:
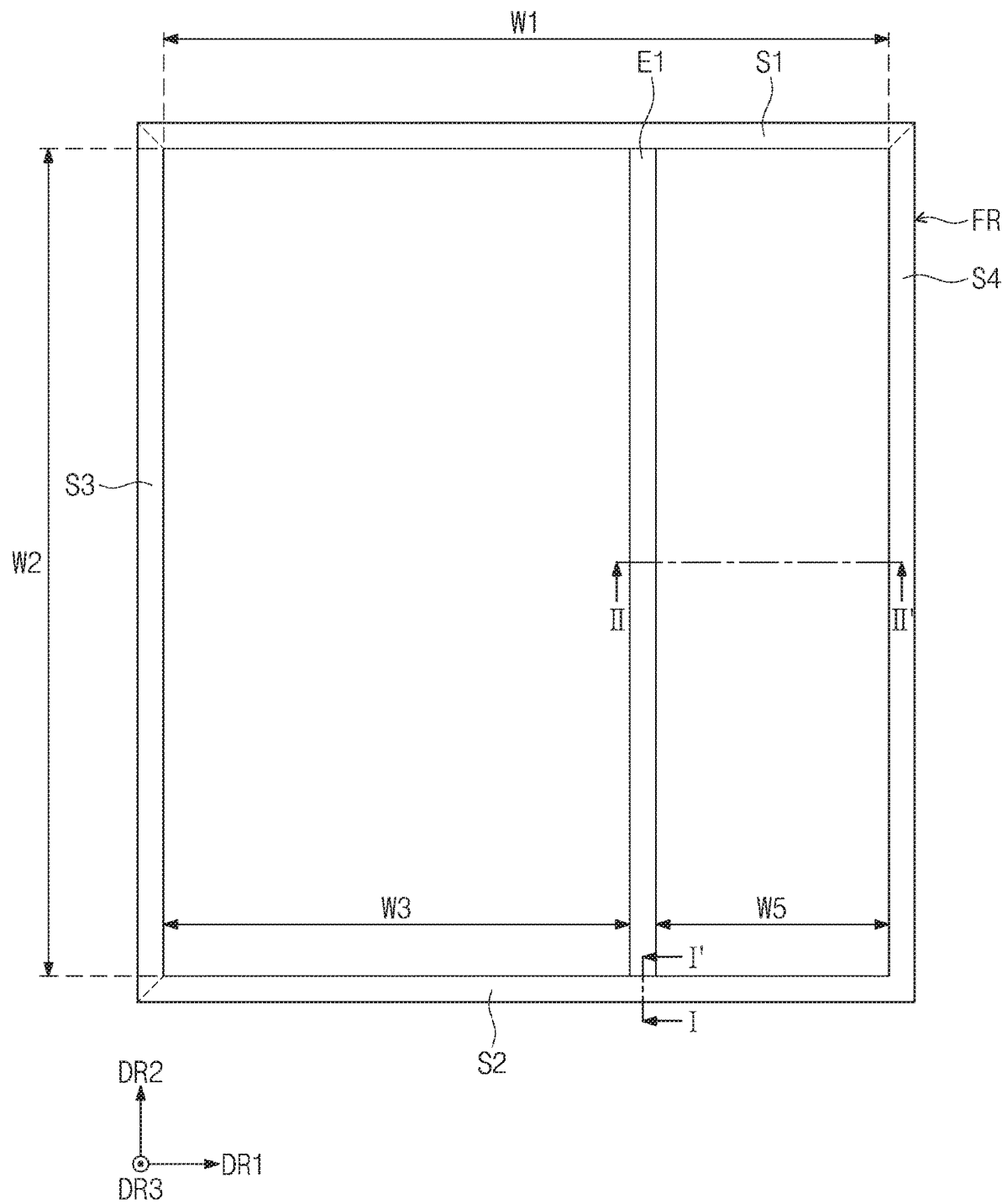
FIGS. 4A, 4B and 4C are views for explaining a method of coupling a first extension part of the mask assembly of FIG. 3.
Figure 4B:
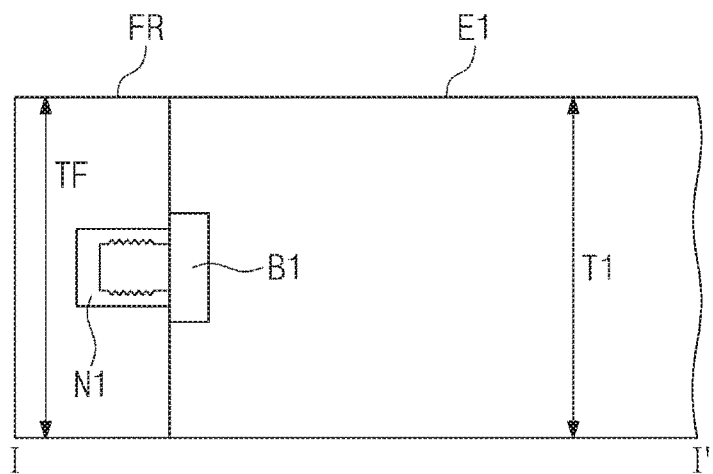
Figure 4B:
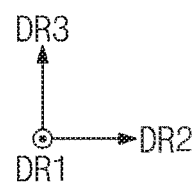
Figure 4C:
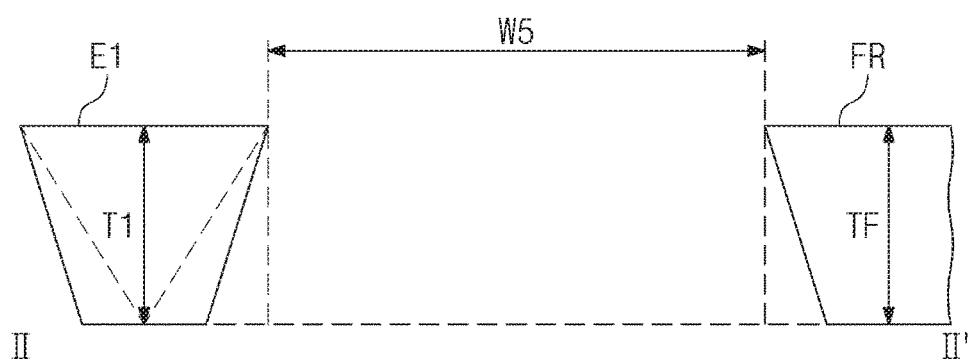
Figure 4C:
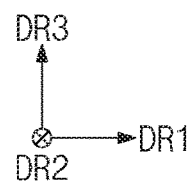

FIGS. 4A to 4C are views for explaining a method of coupling the first extension part of the mask assembly of FIG. 3. Since the second to fourth extension parts E2 to E4 of FIG. 3 are coupled to the first extension part E1, the first extension part E1 may be coupled first to the mask frame FR.

Referring to FIG. 4A, the first extension part E1 may have one end coupled to the first support part S1 of the mask frame FR and the other end coupled to the second support part S2 of the mask frame FR. To prevent the deformation of the first extension part E1 or the drooping of the second to fourth extension parts E2 to E4 coupled to the first extension part E1 from occurring, the first extension part E1 may not be manufactured by the manufacturing apparatus 10 of FIG. 2. The first extension part E1 may be manufactured in a bar type similar to each of the first to fourth support parts S1 to S4. That is, the first extension part E1 may have rigidity similar to that of the mask frame FR.

Referring to FIG. 4B, a cross-sectional view corresponding to a line I-I' of FIG. 4A is illustrated. FIG. 4B is a cross-sectional view of the first extension part E1 and the mask frame FR when viewed in the first direction DR1 with respect to the plane defined by the second direction DR2 and the third direction DR3. Although an example of a coupled area between the first extension part E1 and the second support part S2 is illustrated in FIG. 4B, a coupled area between the first extension part E1 and the first support part S1 may also be the same as illustrated in 4B.

The first extension part E1 may have a thickness T1 in the third direction DR3, and the mask frame FR may have a frame thickness TF in the third direction DR3. To secure the rigidity of the first extension part E1, the first thickness T1 and the frame thickness TF may be substantially the same. However, the embodiment of the inventive concept is not limited thereto. For example, the first thickness T1 may be defined as a thickness that is enough to endure the tensile force for coupling the second to fourth extension parts E2 to E4. The first thickness T1 may be greater than that of each of at least second to fourth extension parts E2 to E4.

The first extension part E1 may include a coupling part for the coupling with the mask frame FR. For example, the coupling part may include a bolt B. The bolt B1 may be inserted into a nut N1 provided in the mask frame FR. However, the shape of the coupling part is not limited to that of FIG. 4B. For example, a groove or hole may be provided in the first extension part E1 so as to insert a head of the bolt B1 and tighten the bolt B1. For example, the first extension part E1 and the mask frame FR may be coupled to each other in various manner such as a coupling pin, a bracket, and the like.

Referring to FIG. 4C, a cross-sectional view corresponding to a line II-II' of FIG. 4A is illustrated. FIG. 4C is a cross-sectional view of the first extension part E1 and the mask frame FR when viewed in the second direction DR2 with respect to the plane defined by the first direction DR1 and the third direction DR3. For example, FIG. 4C illustrates the first extension part E1 and the fourth support part S4 spaced the fifth width W5 from the first extension part E1.

In the cross-section, the first extension part E1 may have a tapered shape. For example, the first extension part E1 may have a trapezoidal shape or triangular shape in which each of an upper surface of the trapezoidal shape or the triangular shape on which the substrate is disposed has a width greater than the of a lower surface. However, the embodiment of the inventive concept of the inventive concept is not limited thereto. For example, the first extension part E1 may have various shapes, for example, have a width in the first direction, which gradually increases in the third direction DR3. Similarly, the mask frame FR may also have a width in the first direction DR1 which gradually increases in the third direction DR3.

When the deposition process is performed, the substrate may be disposed on the upper surface of the first extension part E1 which has the largest width in the first direction DR1. The deposition material may be injected from a lower surface having the smallest width in the first direction DR1 toward the upper surface on which the substrate is disposed in the third direction DR3. If the first extension part E1 has a rectangular shape, the deposition material may be easily deposited on an edge area of the first extension part E1, and thus, the manufactured display panel may be deteriorated in quality. If the first extension part E1 has the tapered shape, the deposition material accumulated on the edge area may be reduced to improve the quality of the manufactured display panel. The shape of the first extension part E1 may be determined in consideration of the first thickness T1, an incident angle of a deposition source in the deposition process, and a weight and drooping degree of the first extension part E1.

Figure 5A:
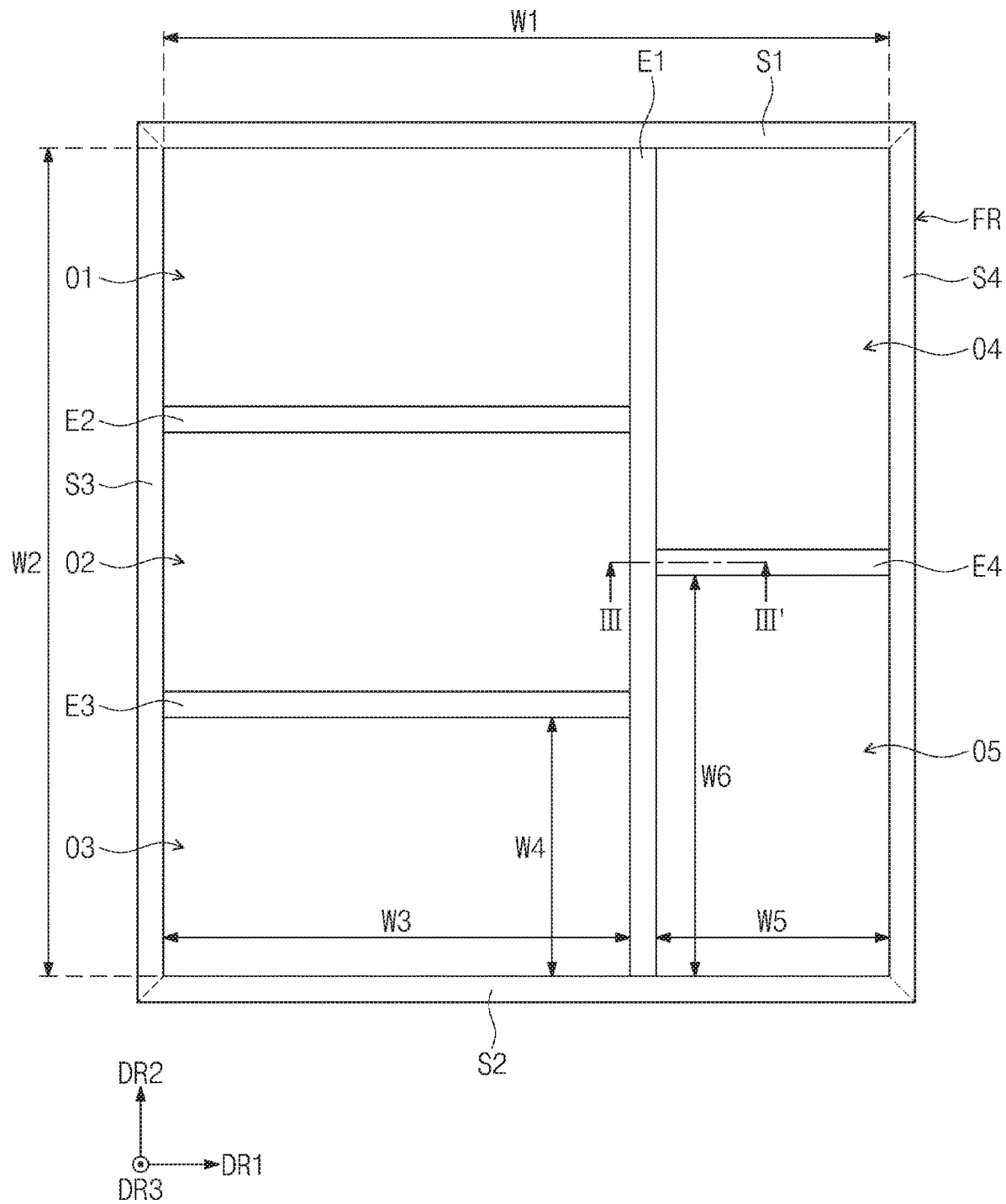
FIGS. 5A and 5B are views for explaining a method of coupling second to fourth extension parts of the mask assembly of FIG. 3.
Figure 5B:
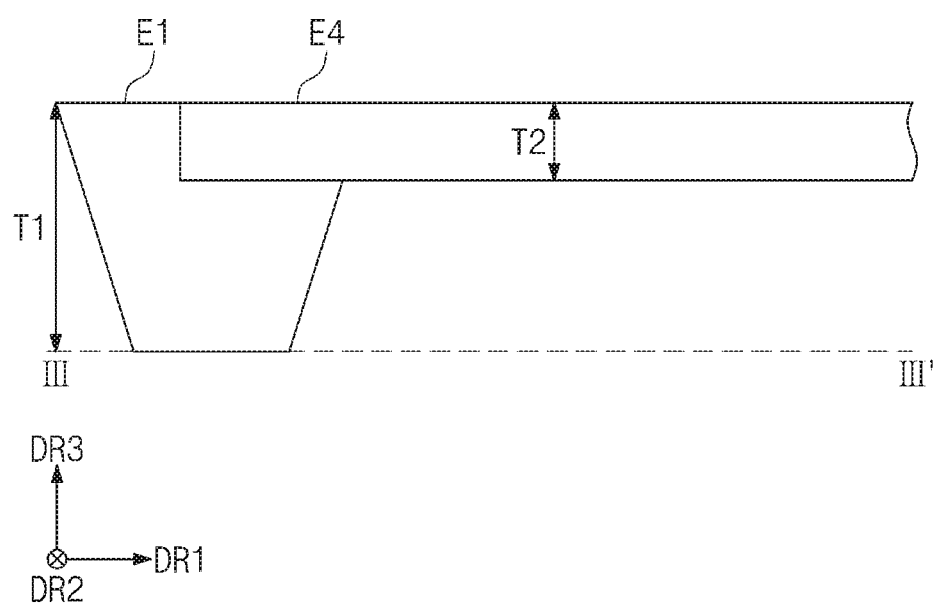

FIGS. 5A and 5B are views for explaining a method of coupling the second to fourth extension parts of the mask assembly of FIG. 3. After the first extension part E1 is coupled to the mask frame FR, the second to fourth extension parts E2 to E4 are coupled to the mask frame FR and the first extension part E1.

Referring to FIG. 5A, each of the second to fourth extension parts E2 to E4 may have one end coupled to the first extension part E1. For example, each of the second to fourth extension parts E2 to E4 may have one end welded to the first extension part E1. Thereafter, each of the second to fourth extension parts E2 to E4 may maintain tension in the first direction DR1. Since the first extension part E1 has enough rigidity, the first extension part E1 may withstand the tensile force in the first direction DR1. As a result of the tension, the other end of each of the second to fourth extension parts E2 to E4 may contact the mask frame FR and then be welded.

Referring to FIG. 5B, a cross-sectional view corresponding to a line III-III' of FIG. 5A is illustrated. FIG. 5B is a cross-sectional view of the first extension part E1 and the fourth extension part E4 when viewed in the second direction DR2 with respect to the plane defined by the first direction DR1 and the third direction DR3. Although an example of a coupled area between the first extension part E1 and the fourth extension part E4 is illustrated in FIG. 5B, a coupled area between the first extension part E1 and the second extension part E2 or between the first extension part E1 and the third extension part E3 may also be the same as illustrated in FIG. 5B.

The first extension part E1 may have a thickness T1 in the third direction DR3, and the second to fourth extension parts E2 to E4 may have a second thickness T2 in the third direction DR3. The first thickness T1 is greater than the second thickness T2. The second thickness T2 may correspond to the thickness of the metal sheet of FIG. 2. The first extension part E1 may withstand the tensile force induced to the first extension part E1 because the first extension part E1 has the first thickness T1 and provide tensile force which is enough to prevent the second to fourth extension parts E2 to E4 from drooping in the first direction DR1.

The first extension part E1 may include recess parts for the coupling with the second to fourth extension parts E2 to E4. The first extension part E1 may include the recess part to remove stepped portion of the first to fourth extension parts E1 to E4 with respect to the surface on which the substrate is disposed. An end of each of the second to fourth extension parts E2 to E4 may be inserted into the recess part of the first extension part E1. To form the recess part, a portion of the first extension part E1 may be removed (e.g., etched or cut). Although not specifically shown, to remove the stepped portions, the one end of each of the second to fourth extension parts E2 to E4 may be removed. The area of the first extension part E1 and the area of each of the second to fourth extension parts E2 to E4 in which the first extension part E1 and the second to fourth extension parts E2 to E4 are removed, respectively, may be welded to each other.

Also, the mask frame FR may include recess parts for the coupling with the second to fourth extension parts E2 to E4. The other end of each of the second to fourth extension parts E2 to E4 may be inserted into the recess part of the mask frame FR. For this, a portion of the mask frame FR and the other ends of the second to fourth extension parts E2 to E4 may also be removed.

Figure 6:
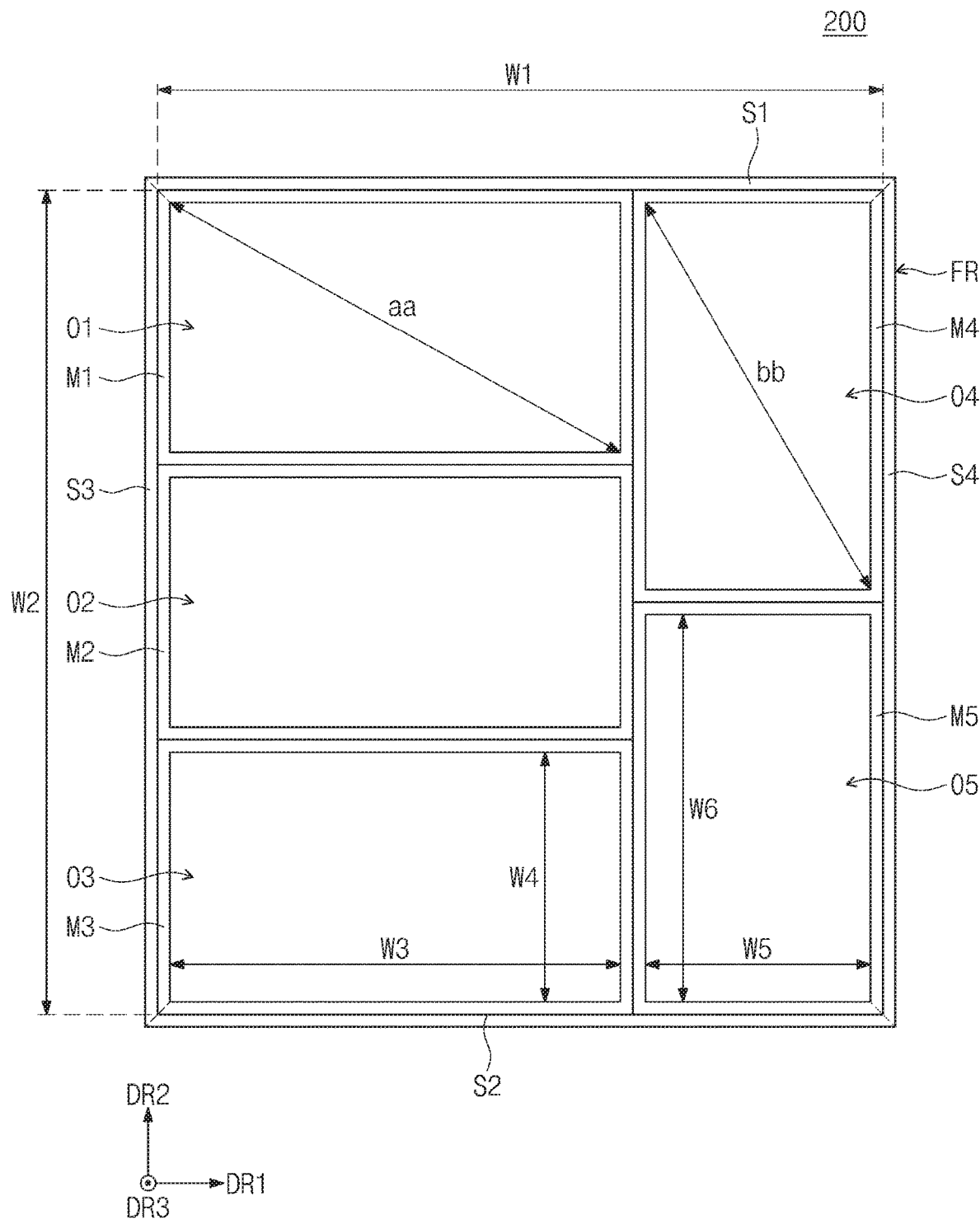
FIG. 6 is a view illustrating an example of a mask assembly according to an embodiment of the inventive concept.

FIG. 6 is a view illustrating an example of a mask assembly according to an embodiment of the inventive concept. The mask assembly 200 of FIG. 6 may be manufactured in the same shape as that of FIG. 1 under the conditions described with reference to FIG. 2. Referring to FIG. 6, the mask assembly 200 includes a mask frame FR and first to fifth masking parts M1 to M5. Each of the mask frame FR and the first to fifth masking parts M1 to M5 may include a material such as invar, but the material forming the mask frame is not limited thereto. Like the mask MSK of FIG. 1, the mask assembly 200 may include the first to fifth deposition areas O1 to O5.

The mask frame FR may have a rectangular shape in a plan view. As described with reference to FIG. 3, the mask frame FR includes first to fourth support parts S1 to S4 so that an opening having a first width W1 in the first direction DR1 and a second width W2 in the second direction DR2 is defined.

Each of the first to third masking parts M1 to M3 may have a rectangular shape surrounding a deposition area having a third width W3 in the first direction DR1 and a fourth width W4 in the second direction DR2. The first masking part M1 is coupled to the first support part S1 and the third support part S3. The second masking part M2 is coupled to the third support part S3 in a space adjacent to the first masking part in the second direction DR2. The third masking part M3 is coupled to the second support part S2 and the third support part S3 in a space adjacent to the second masking part in the second direction DR2.

Each of the fourth and fifth masking parts M4 and M5 may have a rectangular shape surrounding a deposition area having a fifth width W5 in the first direction DR1 and a sixth width W6 in the second direction DR2. The fourth masking part M4 is coupled to the first support part S1 and the fourth support part S4 in a space adjacent to the first masking part M1 and the second masking part M2 in the first direction DR1. The fifth masking part M5 is coupled to the fourth support part S4 and the second support part S2 in a space adjacent to the second masking part M2 and the third masking part M3 in the first direction DR1.

Each of the third width W3 and the sixth width W6 may be greater than the reference width CC. However, each of the fourth width W4 and the fifth width W5 may be less than the reference width CC. In this case, the first to fifth masking parts M1 to M5 may be manufactured by using the manufacturing apparatus 10 of FIG. 2. By coupling the first to fifth masking parts M1 to M5 to the mask frame FR, the mask assembly 200 for manufacturing the large-area display panel may be prepared. When the first to fifth masking parts M1 to M5 are manufactured by using the metal sheets, the first to fifth masking parts M1 to M5 may be coupled to each other before the coupled first to fifth masking parts M1 to M5 may maintain tension when coupled (e.g., welded) to the mask frame FR.

FIGS. 7A to 7E are views for explaining a method for manufacturing the mask assembly of FIG. 6. First, the first to fifth masking parts M1 to M5 of FIG. 6 are coupled to each other, and then, the coupled first to fifth masking parts M1 to M5 are coupled to the mask frame FR. For this, a jig JIG for aligning coupling positions of the first to fifth masking parts M1 to M5 is provided.

Figure 7A:
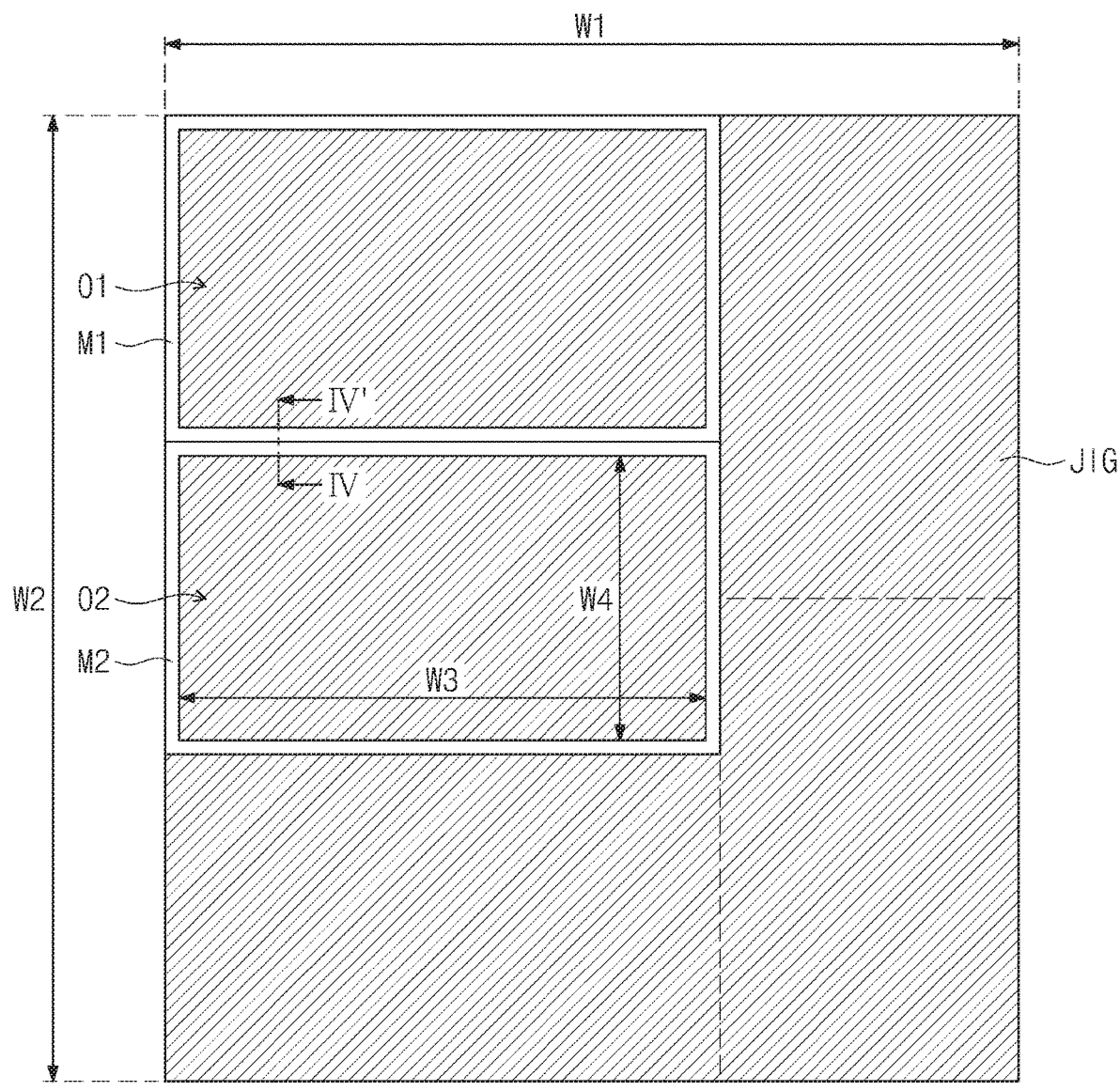
FIGS. 7A, 7B, 7C, 7D and 7E are views for explaining a method for manufacturing the mask assembly of FIG. 6.

Referring to FIG. 7A, the first masking part M1 is disposed on the jig JIG. The coupling position of each of the first to fifth masking parts M1 to M5 may be marked on the jig JIG. The first masking part M1 may be disposed first on the Jig JIG corresponding to a location of the first masking part M1 according to the marks, and then, the second masking part M2 may be disposed on the jig JIG so as to be adjacent in the second direction DR2 from the first masking part M1 according to the marks. The first masking part M1 and the second masking part M2 contact each other on the jig JIG. Areas on which the first and second masking parts M1 and M2 contact each other may be coupled to each other through welding.

Figure 7B:
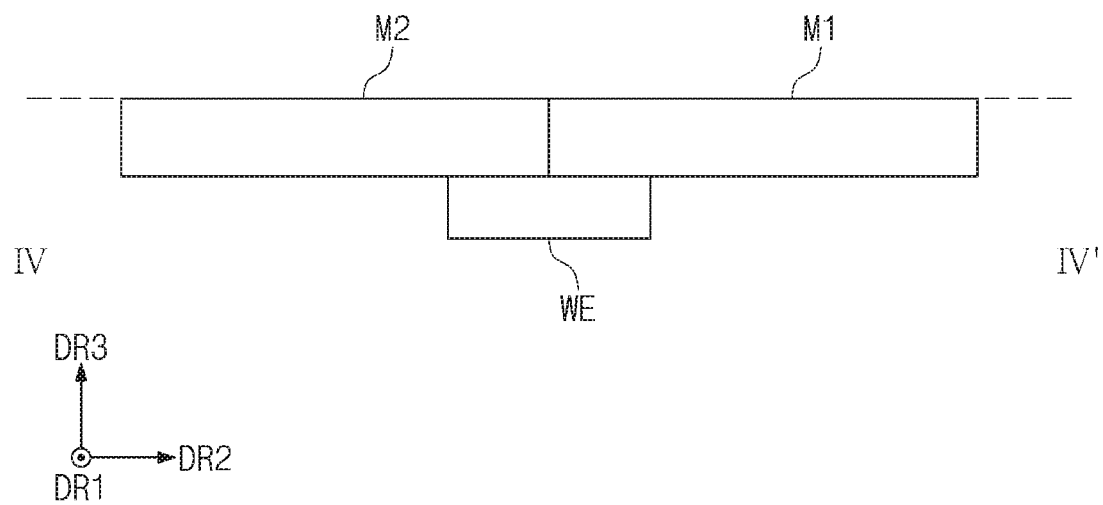

Referring to FIG. 7B, a cross-sectional view corresponding to a line IV-IV' of FIG. 7A is illustrated. FIG. 7B is a cross-sectional view of the areas on which the first and second masking parts M1 and M2 contact each other when viewed in the first direction DR1 with respect to the plane defined by the second direction DR2 and the third direction DR3. Hereinafter, a coupling method of the masking parts illustrated in FIGS. 7C to 7E may be as illustrated in FIG. 7B.

A backing part WE is disposed on the areas on which the first and second masking parts M1 and M2 contact each other. That is, the mask assembly 200 of FIG. 6 may further include the backing part WE for the coupling of the masking parts. The backing part WE may be disposed to contact the first and second masking parts M1 and M2 in the third direction DR3. The backing part WE may be added to the first and second masking parts M1 and M2 so as to couple the first and second masking parts M1 and M2 to each other. The backing part WE and the first masking part M1 are coupled to each other through welding. The backing part WE and the second masking part M2 are coupled to each other through welding.

The first masking part M1 and the second masking part M2 may have the same thickness in the third direction DR3. The first masking part M1 and the second masking part M2 may be manufactured using the same metal sheet by the manufacturing apparatus 10 of FIG. 2. In this case, the first masking part M1 and the second masking part M2 may have the same thickness. When the deposition process is performed, the backing part WE may face the substrate disposed on the mask assembly 200 with respect to the first and second masking parts M1 and M2. Thus, the stepped portion may not be existing in the contact surface of the substrate. Thus, the deposition accuracy of the display panel may be improved to improve the quality of the display panel.

When the mask assembly 200 is manufactured by using the backing part WE, a welding area may increase. Referring to FIG. 7A, the backing part WE may extend by a length greater than the third width W3 in the first direction DR1. Thus, the deformation of the mask may be reduced. Usually, the mask assembly 200 may be cleaned after the deposition process before the next deposition process. The mask assembly 200 may be deformed during the cleaning process and a degree of the deformation may increase according to repeated cleaning processes. The deformation of the mask assembly 200 may be reduced by the presence of the backing part WE and the reinforced shape of the masking part.

Figure 7C:
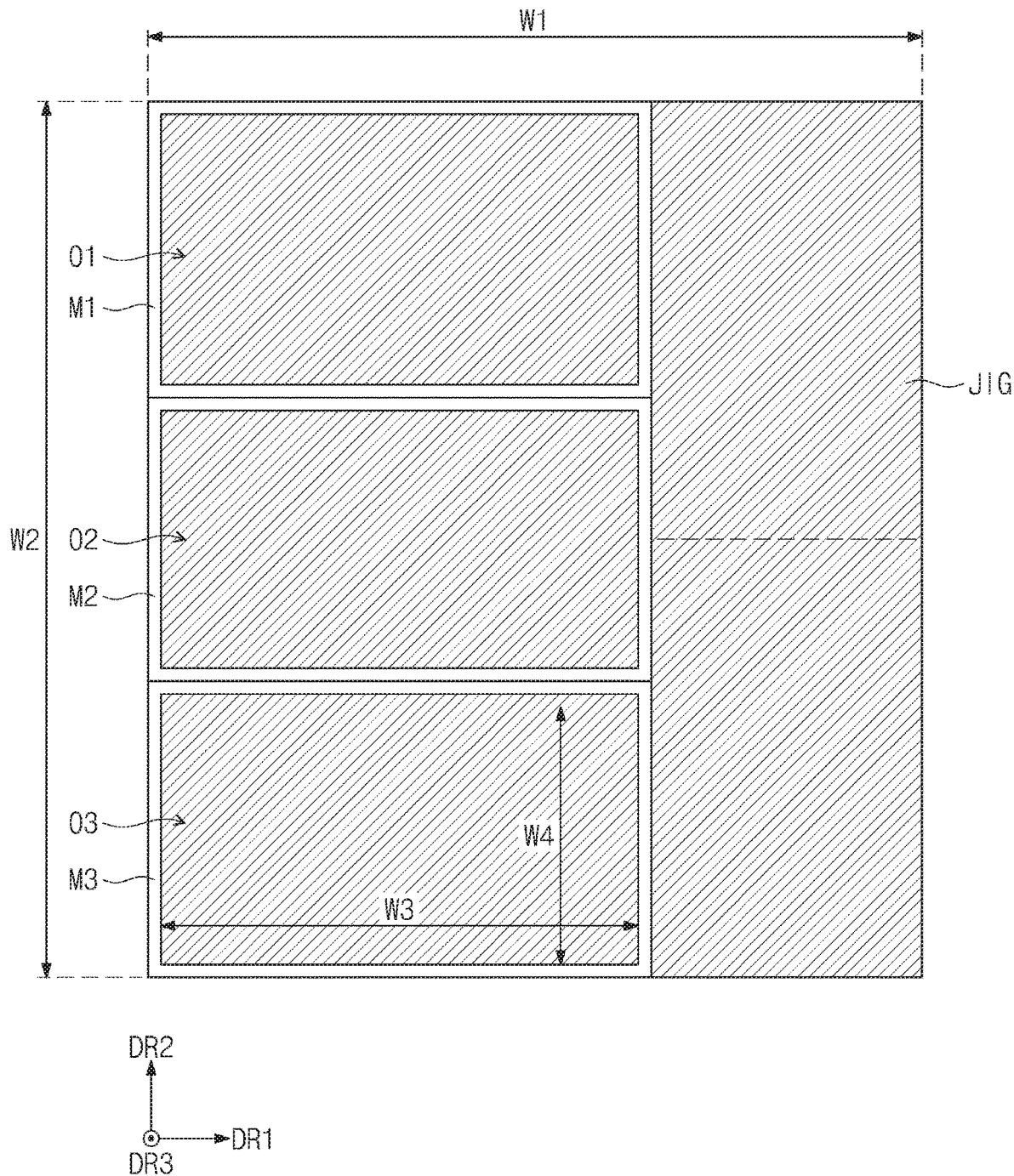

Referring to FIG. 7C, a third masking part M3 may be disposed on the jig JIG adjacent to the second masking part M2 in the second direction DR2. The second masking part M2 and the third masking part M3 may contact each other on the jig JIG and then be coupled to each other through the welding. As illustrated in FIG. 7B, the third masking part M3 may be coupled to the second masking part M2 through the backing part WE.

Figure 7D:
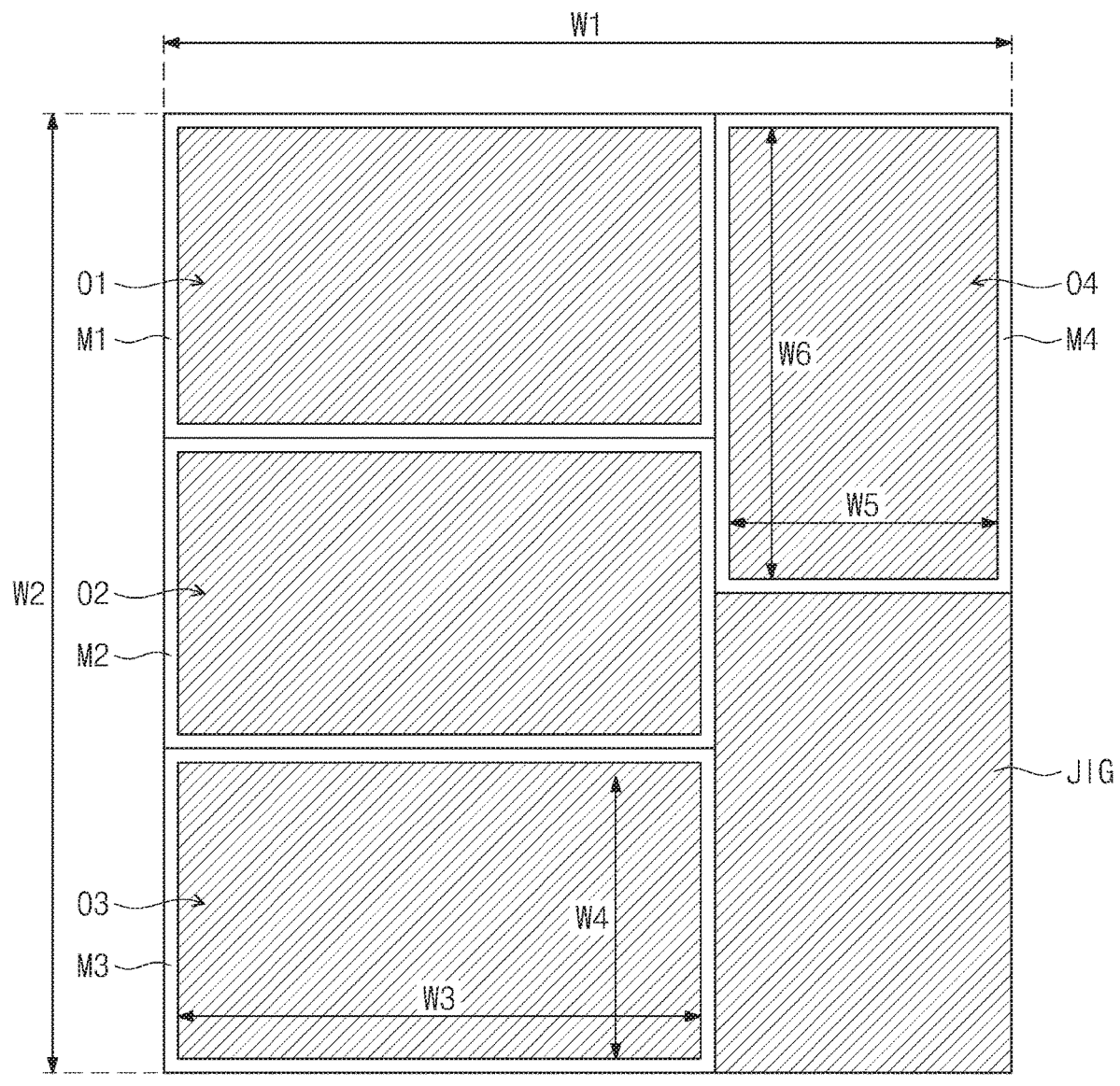

Referring to FIG. 7D, a fourth masking part M4 may be disposed on the jig JIG adjacent to the first and second marking parts M1 and M2 in the first direction DR1. The first marking part M1, the second marking part M2, and the fourth marking part M4 may contact each other on the jig JIG and then be coupled to each other through the welding. As illustrated in FIG. 7B, the fourth masking part M4 may be coupled to the first and second masking parts M1 and M2 through the backing part WE.

Figure 7E:
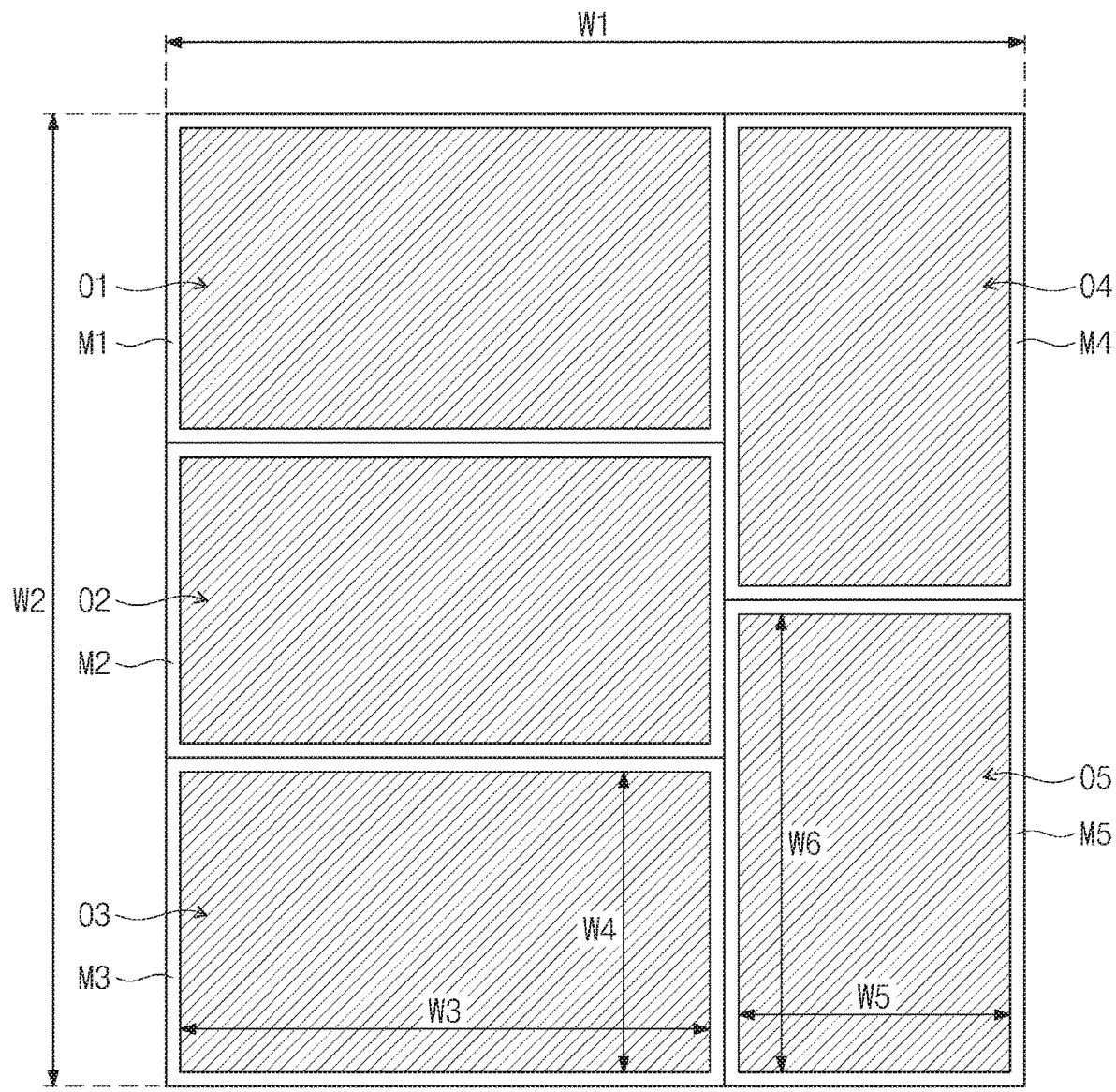

Referring to FIG. 7E, a fifth masking part M5 may be disposed on the jig JIG adjacent to the second and third marking parts M2 and M3 in the first direction DR1 and adjacent to the fourth marking part M4 in the second direction DR2. The second marking part M2, the third marking part M3, the fourth marking part M4, and the fifth marking part M5 may contact each other on the jig JIG and then be coupled to each other through the welding. As illustrated in FIG. 7B, the fifth masking part M5 may be coupled to the second to fourth masking parts M2 to M4 through the backing part WE.

Referring to FIGS. 7A to 7E, the first to fifth marking parts M1 to M5 are sequentially disposed on the jig JIG and coupled to each other, but the method of coupling is not limited thereto. For example, after the first and second marking parts M1 and M2 are coupled to each other, the fourth marking part M4 may be coupled to the first and second marking parts M1 and M2, and then, the third marking part M3 may be coupled to the second marking part M2. That is, the coupling order of the first to fifth marking parts M1 to M5 may be different from that described with reference to FIGS. 7A to 7E.

The first to fifth marking parts M1 to M5 coupled to each other through the backing part WE are coupled to the mask frame FR. The coupled first to fifth marking parts M1 to M5 may be provided in the opening of the mask frame FR and then be welded to the mask frame FR. The coupled first to fifth marking parts M1 to M5 may maintain tension toward the first to fourth support parts S1 to S4 of the mask frame FR and then be welded to the first to fourth support parts S1 to S4.

Figure 8:
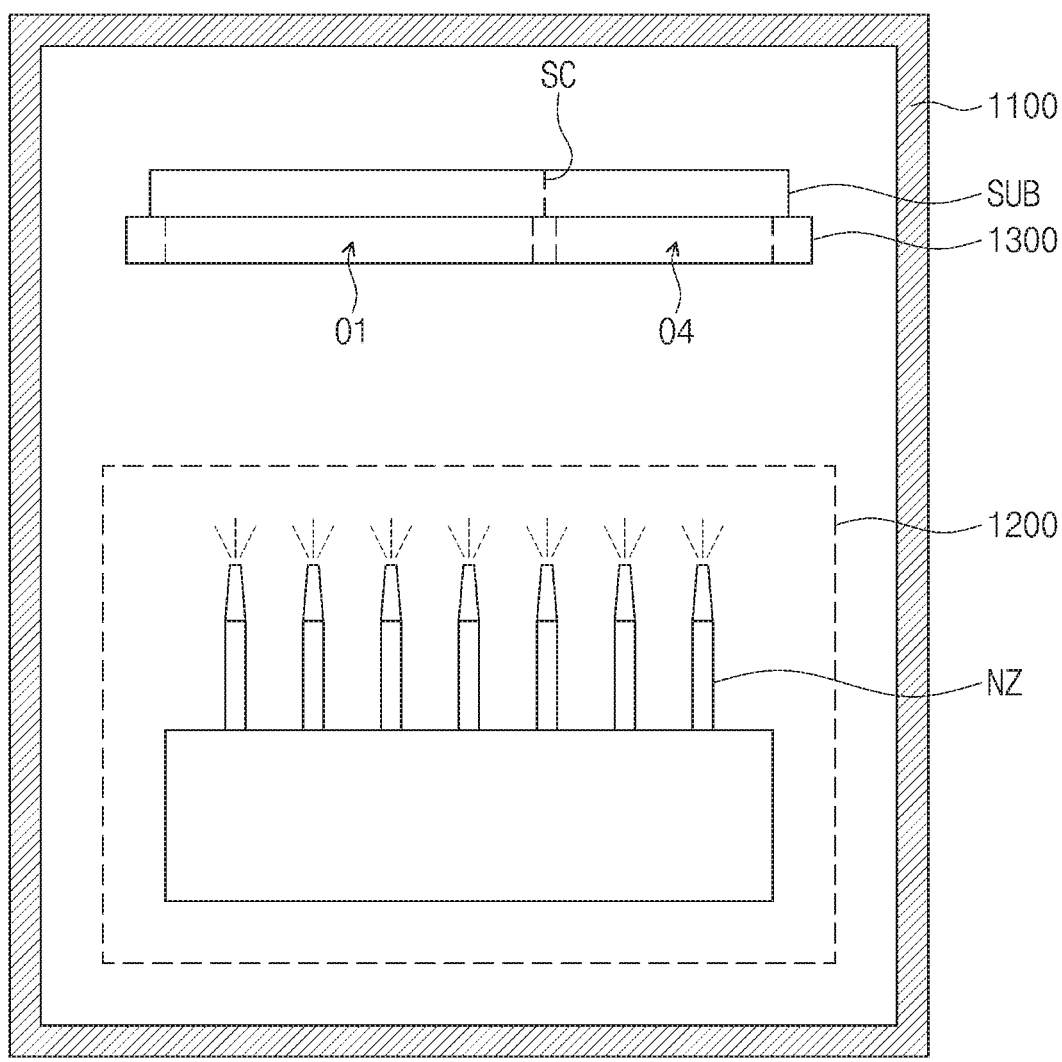
FIG. 8 is a view illustrating an example of a deposition system according to an embodiment of the inventive concept.

FIG. 8 is a view illustrating an example of a deposition system according to an embodiment of the inventive concept. Referring to FIG. 8, a deposition system 1000 may include a chamber 1100, a deposition source injector 1200, and a mask assembly 1300. The deposition system 1000 may be used to depose a thin film in the organic light emitting display device. As described above, each of the deposition areas may have a surface area corresponding to that of one display panel.

The deposition system may deposit a thin film on a substrate SUB, and the substrate SUB may be disposed on the mask assembly during the deposition process. The substrate SUB may include a portion of the organic light emitting panel including organic light emitting elements, and the thin film may be one of organic thin films constituting the organic light emitting elements. For example, the thin film may be a light emitting layer. Alternatively, the thin film may be at least one of an electron injection layer, an electron transport layer, a hole transport layer, or a hole injection layer.

The chamber 1100 may provide a deposition space through which a deposition material moves. The chamber 1100 may be maintained in a vacuum state to prevent foreign substances from being introduced from the outside and secure a movement of the deposition material along a straight line from the deposition source injector 1200 to the substrate SUB. The chamber 1100 according to the inventive concept is not limited to its shape as disclosed in FIG. 8.

The deposition source injector 1200 may be provided in the deposition space within the chamber 1100. For example, the deposition source injector 1200 may be provided in a lower space within the chamber 1100. The deposition source injector 1200 accommodates the deposition material. The deposition material (not shown) may include an organic material. The deposition material may be a material that is in a liquid or solid state at room temperature.

The deposition material injection device 1200 includes a plurality of nozzles NZ. The plurality of nozzles NZ are arranged in the first direction DR1, but the arrangement of the nozzles NZ is not limited thereto. The arrangement and number of the plurality of nozzles NZ are not limited as described in FIG. 8. Each of the plurality of nozzles NZ may inject the deposition material in the third direction DR3. For example, the deposition source injector 1200 may evaporate the deposition material to provide the evaporated deposition material to the plurality of nozzles NZ. The plurality of nozzles NZ may inject the deposition material toward the mask assembly 1300 and the substrate SUB.

The mask assembly 1300 may include the mask assembly 100 of FIG. 3 or the mask assembly 200 of FIG. 6, each of which has the mask shape MSK of FIG. 1. The mask assembly 1300 is disposed to be spaced apart from the deposition source injector 1200 in the third direction DR3. The deposition material injected from the plurality of nozzles NZ is provided to the mask assembly 1300 and the substrate SUB. Some areas of the substrate SUB corresponding to first to fifth deposition areas O1 to O5 of the mask assembly 1300 are exposed. The deposition material may be provided on the exposed areas of the substrate SUB.

After the deposition process using the deposition material is performed, the substrate SUB may be cut to have a size of the display panel. For example, the deposition material may be provided on the area exposed by the first deposition area O1 and the second deposition area O4 of the mask assembly 1300, and the substrate SUB may be cut with respect to a scribing line SC in FIG. 8. That is, the display panel corresponding to the first deposition area O1 and the display panel corresponding to the fourth deposition area O4 may be separated from each other. When the deposition process is performed by using the mask assemblies 100 and 200 of FIGS. 3 and 6, respectively, five display panels may be manufactured. Thus, the display panels having various sizes may be manufactured at the same time.

As described above, the deposition area having the wide width may be provided to improve the cutting efficiency and manufacture the display panel having the various areas. In addition, a portion of the constituents of the mask may increase in thickness, or the welding using a backing part may be performed to improve the positioning accuracy of the mask and reduce the deformation and stepped portion of the mask.

It will be apparent to those skilled in the art that various modifications and variations can be made in the inventive concept. Thus, it is intended that the present disclosure covers the modifications and variations of this invention provided they come within the scope of the appended claims and their equivalents.

Hence, the real protective scope of the inventive concept shall be determined by the technical scope of the accompanying claims.

What is claimed is:

1. A mask assembly comprising:
    a mask frame comprising a first support part extending in a first direction, a second support part spaced apart from the first support part and extending in the first direction, a third support part extending in a second direction and disposed between one end of the first support part and one end of the second support part, and a fourth support part spaced apart from the third support part, extending in the second direction, and disposed between the other end of the first support part and the other end of the second support part; and
    a mask coupled to the mask frame, wherein the mask comprises:
    a first masking part coupled to the first support part and the third support part and comprising a first opening corresponding to a first deposition area;
    a second masking part coupled to the first support part, the fourth support part, and the first masking part and comprising a second opening corresponding to a second deposition area;
    a third masking part coupled to the third support part, the first masking part, and the second masking part and comprising a third opening corresponding to a third deposition area;
    a fourth masking part coupled to the fourth support part, the second masking part, and the third masking part and comprising a fourth opening corresponding to a fourth deposition area; and
    a fifth masking part couple to the second support part, the third support part, the third masking part, and fourth masking part and comprising a fifth opening corresponding to a fifth deposition area,
    wherein the first deposition area, the third deposition area, and the fifth deposition area are arranged in the second direction, the second deposition area and the fourth deposition area are arranged in the second direction,
    wherein each of the first deposition area, the third deposition area and the fifth deposition area has a first width greater than a reference width in the first direction and a second width less than the first width in the second direction, and each of the second deposition area and the fourth deposition area has a third width less than the first width in the first direction and a fourth width greater than the reference width in the second direction, and
    wherein a diagonal length of the first deposition area is greater than a diagonal length of the second deposition area.

2. The mask assembly of claim 1, wherein thicknesses of the first to third masking parts are the same.

3. The mask assembly of claim 1, wherein the mask further comprises:

a backing part disposed on an area, on which the first masking part and the second masking part contact each other, an area, on which the first masking part and the third masking part contact each other, and an area, on which the second masking part and the third masking part contact each other, wherein the backing part is coupled in a third direction crossing the first and second directions from the first to third masking parts.

* * * * *